United States Patent [19]

Kim

[11] Patent Number: 5,728,597
[45] Date of Patent: Mar. 17, 1998

[54] METHOD FOR FORMING A CAPACITOR IN A SEMICONDUCTOR DEVICE

[75] Inventor: Suk Soo Kim, Kyoungkido, Rep. of Korea

[73] Assignee: Hyundai Electronics Industries Co., Ltd., Kyoungkido, Rep. of Korea

[21] Appl. No.: 523,864

[22] Filed: Sep. 6, 1995

[30] Foreign Application Priority Data

Sep. 9, 1994 [KR] Rep. of Korea ............... 1994-22783

[51] Int. Cl.⁶ ........................................ H01L 21/8242
[52] U.S. Cl. .......................... 437/60; 148/DIG. 14; 437/47; 437/52; 437/919
[58] Field of Search .................. 148/DIG. 14; 437/47, 437/48, 52, 60, 919

[56] References Cited

U.S. PATENT DOCUMENTS

| | | | |
|---|---|---|---|
| 5,389,560 | 2/1995 | Park | 437/52 |
| 5,482,886 | 1/1996 | Park et al. | 437/60 |
| 5,550,080 | 8/1996 | Kim | 437/60 |

Primary Examiner—Chandra Chaudhari
Assistant Examiner—Toniae M. Thomas
Attorney, Agent, or Firm—Jacobson, Price, Holman & Stern, PLLC

[57] ABSTRACT

A method for forming a charge storage electrode in a semiconductor device, comprising the steps of: providing a transistor having an active region on a substrate, and forming an oxide layer on the resulting structure; providing a first conducting layer being patterned and being contacted with said active region of said transistor, wherein said first conducting layer has at least one recess on the surface thereof; forming a buried oxide layer on said recess; forming a first selective growing oxide layer only on said oxide layer; forming a second selective growing oxide layer on said first selective growing oxide layer and said buried oxide layer, exposing a portion of said first conducting layer; forming a second conducting layer on the resulting structure; patterning said second conducting layer and exposing a second selective growing oxide layer; and removing said second selective growing oxide layer, said first selective growing oxide layer, said buried oxide layer, and said oxide layer.

4 Claims, 3 Drawing Sheets

METHOD FOR FORMING A CAPACITOR IN A SEMICONDUCTOR DEVICE

BACKGROUND OF THE INVENTION

The present invention relates to a method for forming a capacitor in a semiconductor device, and more particularly to a method for forming a capacitor, having a wide surface area, without complexity process.

With respect to commercial semiconductor memory devices, integrated dynamic random access memories (DRAMs), a major factor is how to obtain a higher capacitance in a charge storage electrode in accordance with a decrease in the cell area. However, the formation of a higher integrated circuitry inevitably comes with a decrease in the area of the chip and unit cell. Then, high technical processes and the reliability of the device, to increase the capacitance of the capacitor in DRAM, have been demanded.

One of these efforts is to increase the surface of the charge storage electrode, and the other is to use a ferroelectric film in the capacitor. However, as of yet, use of the ferroelectric film has not provided a satisfying capacitance for the capacitor in a DRAM. Accordingly, an increase in the effective area of the capacitor has been further developed instead of proving the ferroelectric film.

On the other hand, an increase in the effective area of the capacitor causes a complex manufacturing processes and a stacked capacitor increase topology which makes the rear process difficult. Particularly, an increase in the capacitor's topology decreases the process margin considerably when a lithography is performed to form metal wiring.

SUMMARY OF THE INVENTION

It is, therefore, an object of the present invention to provide a method for forming a charge storage electrode having a wide surface area in a definite cell area to increase capacitance, using simple manufacturing processes.

In order to accomplish the above object, a method for forming a charge storage electrode in a semiconductor device, comprising the steps of: providing a transistor having an active region on a substrate, and forming an oxide layer on the resulting structure; providing a first conducting layer being patterned and being contacted with said active region of said transistor, wherein said first conducting layer has at least one recess on the surface thereof; forming a buried oxide layer on said recess; forming a first selective growing oxide layer only on said oxide layer; forming a second selective growing oxide layer on said first selective growing oxide layer and said buried oxide layer, exposing a portion of said first conducting layer; forming a second conducting layer on the resulting structure; patterning said second conducting layer and exposing a second selective growing oxide layer; and removing said second selective growing oxide layer, said first selective growing oxide layer, said buried oxide layer, and said oxide layer.

Also, in order to accomplish the above object, a method for forming a charge storage electrode in a semiconductor device, comprising of the steps of: providing a transistor having an active region on a substrate, depositing a first oxide layer on the resulting structure, and etching said first oxide layer in order to form a contact hole which exposes said active region; forming a first conducting layer on the resulting structure, whose upper surface has a recess in the middle of said contact hole; forming a second oxide layer on said first conducting layer; etching back said second oxide layer and forming a buried oxide layer, which is a residual thereof, on said recess; forming a first etching barrier layer on said first conducting layer and said buried oxide layer, and patterning said first conducting layer, such that said second oxide layer is exposed; growing a first selective growing oxide layer on said first oxide layer and removing said first etching barrier layer, so as to expose said first selective growing oxide layer and said oxide buried layer; growing a second selective growing oxide layer on said first selective growing oxide layer and said oxide buried layer, exposing a portion of said first conducting layer; forming a second conducting layer on the resulting structure, being connected with said first conducting layer; forming a second etching barrier layer to expose a portion of said second conducting layer, etching said second conducting layer, and removing second etching barrier layer; forming a third etching barrier layer on the resulting structure and etching said second conducting layer in order to define said charge storage electrode; and removing said third etching barrier layer and etching said first and second selective growing oxide layers and said oxide buried layer.

BRIEF DESCRIPTION OF THE DRAWINGS

The above and other objects, features and other advantages of the present invention well be more clearly understood from the following detailed description taken in conjunction with the accompanying drawings, in which.

DETAILED DESCRIPTION OF THE PRESENT INVENTION

FIGS. 1A to 1E show a method for forming a charge storage electrode, which is in connection with the active layer on the substrate, in accordance with the present invention. Also, to make illustration brief, a transistor and a substrate are not shown in FIGS. 1A to 1E.

Figure 1A:
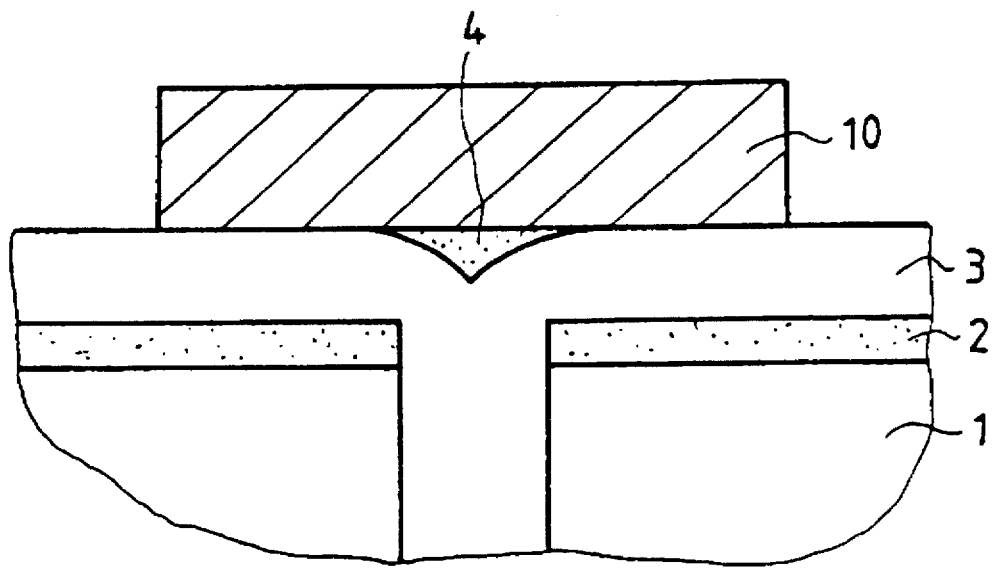
FIGS. 1A to 1E are sectional views of a DRAM cell, showing the process for production of the stacked capacitor in accordance with the preferred embodiment of the present invention.

Referring now to FIG. 1A, an insulating layer 1 and an oxide layer 2 are, in turn, formed on a transistor and a substrate (not shown). A planarization process is applied to the upper portion of the insulating layer 1. A polysilicon layer 3 is deposited and contacted with the active region of the transistor through the contact hole which is formed by etching a portion of the oxide layer 2 and the insulating layer 1. At this time, since the contact hole is filled with the polysilicon layer 3, a recess is formed on the concave surface of the polysilicon layer 3 in the middle of the contact hole. Next, an oxide layer is formed on the polysilicon layer 3, and is etched back by using a dry-etching process which results in a planarization process to perform the lithography process. Then, an oxide buried layer 4 is formed only in the recess. A photoresist layer 10 is formed on the polysilicon layer 3 and the oxide buried layer 4 in order to define the charge storage electrode.

Figure 1B:
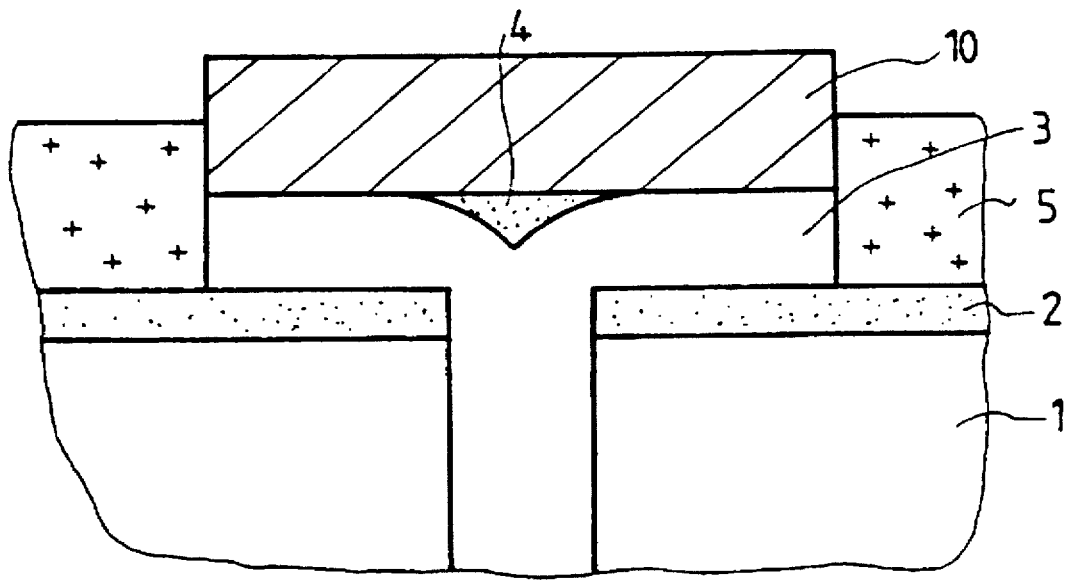

Referring now to FIG. 1B, the polysilicon layer 3 is etched using the photoresist layer 10 as an etching mask, such that a portion of the oxide layer 2 is exposed. A selective growing oxide layer 5 is grown on the exposed oxide layer 2. In the preferred embodiment, the topology of the selective growing oxide layer 5 must be higher than that of the boundary between the photoresist layer 10 and the polysilicon layer 3 in order to increase the surface area of the charge storage electrode.

Figure 1C:
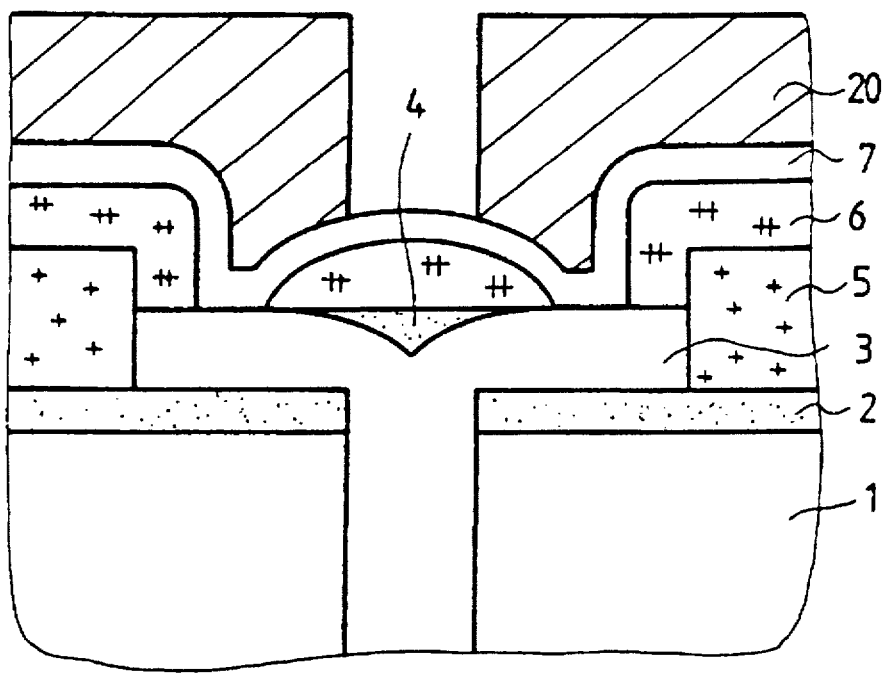

Referring now to FIG. 1C, the photoresist layer 10 is removed, then the polysilicon layer 3 and the buried oxide layer 4 are exposed. A selective growing oxide layer 6 is then grown on the exposed selective growing oxide layer 5 and the buried oxide layer 4. At this time, the selective growing oxide layer 6 must be controlled in order that the polysilicon layer 3 is not fully covered by it. That is to say, a portion of the polysilicon layer 3 must be exposed to be in connection with the polysilicon layer which will be formed in the following deposition process. Next, a polysilicon layer 7 is formed on the resulting structure, it is connected with the exposed polysilicon layer 3. A photoresist layer 20 is then formed, exposing a portion of the polysilicon layer 7 overlaying the buried oxide layer 4.

Figure 1D:
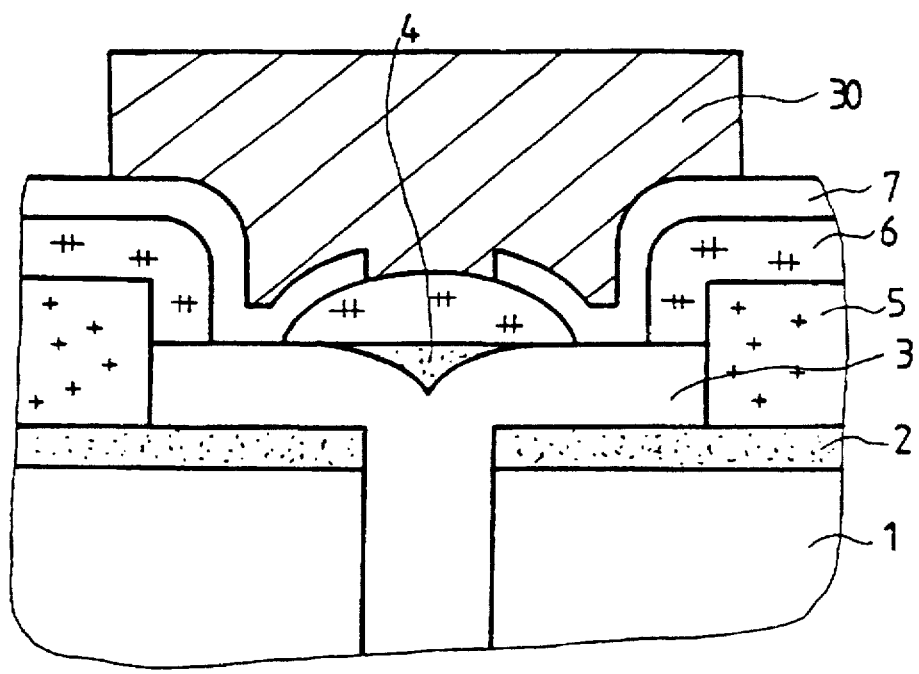

Referring now to FIG. 1D, the polysilicon layer 7 is etched, using the photoresist layer 20 as an etching mask, and a photoresist layer 30 is formed to define the size of the polysilicon layer 7.

Figure 1E:
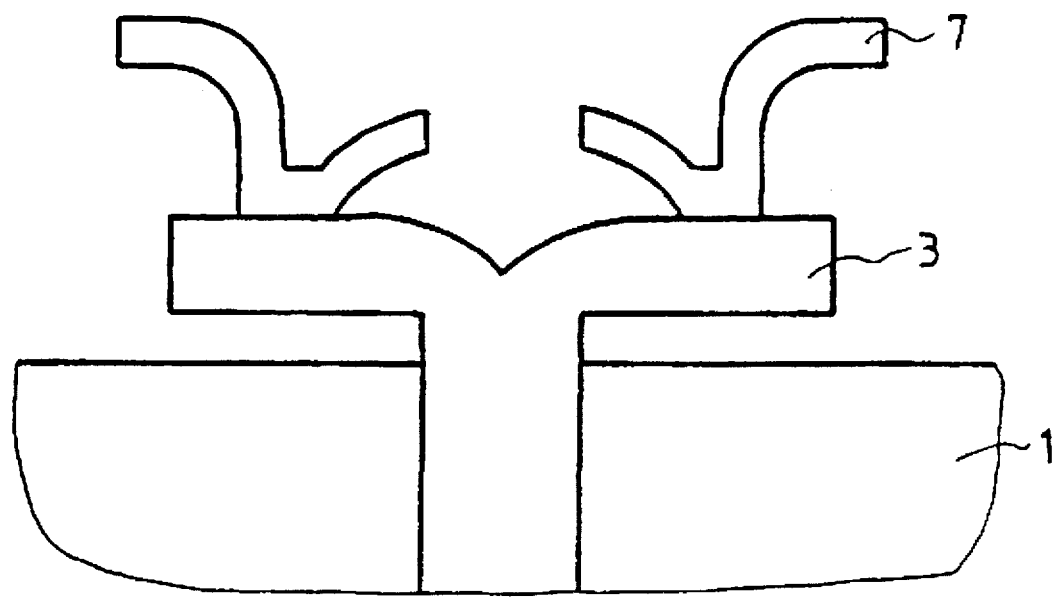

As shown in FIG. 1E, the exposed polysilicon layer 7 is etched, and a wet-etching process is applied to the selective growing oxide layers 5 and 6. Also, the removal of the oxide layer 2 contributes to an increase of the surface area in the charge storage electrode.

Furthermore, those who have ordinary skill in the art to which the subject matter pertains can easily understand that the capacitance of the charge storage electrode may be increased, by forming a plurality of buried oxide layers and selective growing oxide layers.

As illustrate above, charge storage electrodes in accordance with the present invention can obtain a higher capacitance by increasing the surface area thereof through the selective growing technique of the oxide layers.

What is claimed is:

1. A method for forming a charge storage electrode in a semiconductor device, comprising the steps of:

a) providing a transistor having an active region on a substrate, and forming an oxide layer on the substrate including said transistor and said active region;

b) providing a patterned first conducting layer in contact with said active region of said transistor, wherein said first conducting layer has at least one recess on the surface thereof;

c) forming a buried oxide layer on said recess;

d) forming a first selectively grown oxide layer only on said oxide layer (formed in step e);

e) forming a second selectively grown oxide layer on said first selectively grown oxide layer and said buried oxide layer, exposing a portion of said first conducting layer;

f) forming a second conducting layer on the resulting structure (formed in step e);

g) patterning said second conducting layer and exposing a second selectively grown oxide layer; and h) removing said second selectively grown oxide layer, said first selectively grown oxide layer, said buried oxide layer, and said oxide layer.

2. A method in accordance with claim 1, wherein the step h) further comprises the step of removing an upper portion of said oxide layer.

3. A method for forming a charge storage electrode in a semiconductor device, comprising of the steps of:

a) providing a transistor having an active region on a substrate, depositing a first oxide layer on said first oxide layer and in contact with said active region through said contact hole, and etching said first oxide layer in order to form a contact hole which exposes said active region;

b) forming a first conducting layer on the resulting structure, whose upper surface has a recess in the middle of said contact hole;

c) forming a second oxide layer on said first conducting layer;

d) etching back said second oxide layer and forming a buried oxide layer, which is a residual thereof, on said recess;

e) forming a first etching barrier layer on said first conducting layer and said buried oxide layer, and patterning said first conducting layer, such that said second oxide layer is exposed;

f) growing a first selectively grown oxide layer on said first oxide layer and removing said first etching barrier layer, so as to expose said first selectively grown oxide layer and said oxide buried layer;

g) growing a second selective growing oxide layer on said first selectively grown oxide layer and said oxide buried layer, exposing a portion of said first conducting layer;

h) forming a second conducting layer on the resulting structure, being connected with said first conducting layer;

i) forming a second etching barrier layer to expose a portion of said second conducting layer, etching said second conducting layer, and removing second etching barrier layer;

j) forming a third etching barrier layer on the resulting structure and etching said second conducting layer in order to define said charge storage electrode; and k) removing said third etching barrier layer and etching said first and second selective growing oxide layers and said oxide buried layer.

4. A method in accordance with claim 3, wherein the step k) further comprises the step of removing an upper portion of said first layer.

* * * * *